US005703753A

United States Patent [19]
Mok

[11] Patent Number: 5,703,753
[45] Date of Patent: Dec. 30, 1997

[54] MOUNTING ASSEMBLY FOR MULTIPLE CHIP MODULE WITH MORE THAN ONE SUBSTRATE AND COMPUTER USING SAME

[75] Inventor: Sammy L. Mok, Cupertino, Calif.

[73] Assignee: MicroModule Systems Inc., Cupertino, Calif.

[21] Appl. No.: 677,178

[22] Filed: Jul. 9, 1996

Related U.S. Application Data

[63] Continuation-in-part of PCT/US96/02139, Feb. 16, 1996, and a continuation-in-part of Ser. No. 551,432, Nov. 1, 1995, abandoned, which is a continuation-in-part of Ser. No. 389,905, Feb. 16, 1995, Pat. No. 5,619,399.

[51] Int. Cl.$^6$ .................................................. H05K 7/20
[52] U.S. Cl. ..................... 361/715; 174/16.3; 257/712; 257/718; 361/707; 361/785; 439/66; 439/485
[58] Field of Search ................ 174/16.3; 257/710–719, 257/706, 712, 726–727; 361/687, 704, 707, 709–721, 770, 784–785, 792; 439/66, 73, 83, 91, 485, 486

[56] References Cited

U.S. PATENT DOCUMENTS

| | | |
|---|---|---|
| 4,642,889 | 2/1987 | Grabbe . |
| 4,774,632 | 9/1988 | Neugebauer . |
| 5,003,429 | 3/1991 | Baker et al. . |
| 5,010,038 | 4/1991 | Fox et al. . |
| 5,074,799 | 12/1991 | Rowlette, Sr. . |
| 5,229,917 | 7/1993 | Harris et al. . |
| 5,251,097 | 10/1993 | Simmons et al. . |
| 5,321,583 | 6/1994 | McMahon . |
| 5,424,913 | 6/1995 | Swindler . |
| 5,457,604 | 10/1995 | Ando . |
| 5,473,510 | 12/1995 | Dozier, II . |

FOREIGN PATENT DOCUMENTS

WO 96/25839   8/1996   WIPO .

Primary Examiner—Gregory D. Thompson

[57] ABSTRACT

A mounting assembly for a multiple chip module or other circuit module, which includes a board having a surface including an array of board contacts, such as a printed wiring board in a computer system. A circuit module, such as a multiple chip module, having a first surface and a second surface is included. The circuit module includes an array of circuit contacts on the first surface of the circuit module. An interposer between the board and the first surface of the circuit module, includes conductors between the circuit contacts in the array of circuit contacts on the circuit module and board contacts in the array of board contacts on the board. A thermal bridge member contacts the second surface of the circuit module. A heat spreader contacts the thermal bridge member to dissipate the heat over a large region. A fastener fastens the board, interposer, circuit module, thermal bridge member, and heat spreader together, such that thermal contact is made between the circuit module and the thermal bridge member and between the thermal bridge member and the heat spreader, and electrical contact is made between the array of circuit contacts and the conductors in the interposer, and between the conductors in the interposer and the array of board contacts. The fastener comprises a releasable mechanism which allows the circuit module to be easily inserted or removed. A circuit module may include the host processor and supporting circuitry for a computer. Also, the circuit module may include more than one multiple chip substrate, or a multiple chip substrate combined with a printed wiring board substrate on which contact areas are formed.

22 Claims, 7 Drawing Sheets

MOUNTING ASSEMBLY FOR MULTIPLE CHIP MODULE WITH MORE THAN ONE SUBSTRATE AND COMPUTER USING SAME

The present application is a continuation-in-part of International patent application Ser. No. PCT/US96/02139, filed 16 Feb. 1996, and a continuation-in-part of application Ser. No. 08/551,432, filed 1 Nov. 1995, now abandoned, which is a continuation-in-part of application Ser. No. 08/389,905, filed 16 Feb. 1995, now U.S. Pat. No. 5,619,399.

BACKGROUND OF THE INVENTION

1. Field of the Invention

The present invention relates to techniques for mounting integrated circuits on circuit boards; and more particularly to a more efficient mounting assembly for multiple chip modules which allows easy assembly of computers using multiple chip modules.

2. Description of Related Art

A multiple chip module (MCM) consists of multiple unpackaged integrated circuits assembled into a sub-system the size of traditional single chip packages. One type of multiple chip module includes a substrate, a thin film interconnect structure, and a plurality of integrated circuits mounted on the interconnect structure, and encapsulated in an epoxy passivation material.

MCMs represent an important new trend in interconnect packaging, offering users higher performance, lower costs, and smaller form factors than traditional printed circuit boards with plated through hole and surface mount technologies. By densely mounting multiple unpackaged integrated circuits on to one substrate, distances between components are reduced, thereby frequently improving performance and typically reducing the form factor of the sub-system.

By eliminating the need for single chip packages, MCM technologies eliminate an entire level of interconnect, and permit significantly greater reductions in product footprint than other interconnect technologies. While the reduction in form factor is itself of great value, MCMs also tend to increase performance and reduce cost. By densely packaging multiple chips onto a substrate, distances are reduced, which generally increases performance because signals do not have to travel so far between components, and results in cost savings through higher yields and reduced material requirements.

Multiple chip modules also create unique mounting problems. In particular, dense functionality means that there are large number of input/output paths which must be connected from the multiple chip module to the circuit board on which they are mounted. Also, the density of functionality concentrates the sources of heat in a small module. Thus, multiple chip modules must be mounted in a manner which dissipates the heat generated in the small package.

Thus, multiple chip modules present a package with hundreds of leads in a very small footprint, and provide a concentrated source of heat which must be dissipated. For many applications, the heat must be dissipated without active cooling systems such as fans. Thus, the multiple chip module may often be mounted on a heat spreading system such a large heat conductive plate which spreads the heat over a large area.

Another problem facing integrated circuit mounting technologies is the ability to replace or upgrade existing chips. Thus, when a computer is sold with one generation host central processing unit, such as an Intel class 386 processor, and the user desires to upgrade the computer to a class 486 processor, the user must replace at least the entire mother board on the computer. Some special packaging technologies have been developed to support processor upgrades, but they involve increases in form factor for the mother board, and require specialized mounting technology.

Accordingly, it is desirable to implement a multiple chip module which provides for efficient thermal dissipation without use of a fan or other active cooling technology, reduces the size of the system over single chip component implementations, is low cost, provides good electrical characteristics which handle 100 MHz or higher clock rates, and is easily installed and replaced into a completely assembled laptop or notebook case.

SUMMARY OF THE INVENTION

The present invention provides a mounting assembly for a multiple chip module or other circuit module, which allows for efficient thermal dissipation, dense functionality with very high lead count, good electrical characteristics to handle high speed clocks, and is easily installable.

According to one aspect, the invention can be characterized as an electronic assembly which comprises a board having a surface including an array of board contacts, such as a printed wiring board in a computer system. A circuit module, such as a multiple chip module, having a first surface and a second surface is included. The circuit module includes an array of circuit contacts on the first surface. A heat spreader contacts the second surface of the circuit module to dissipate the heat over a large region. A fastener fastens the board, circuit module, and heat spreader together, such that thermal contact is made between the circuit module and the heat spreader, and electrical contact is made between the array of circuit contacts and the array of board contacts.

A connector is used between the board and the first surface of the circuit module, and includes conductors between the circuit contacts in the array of circuit contacts on the circuit module and board contacts in the array of board contacts on the board.

To facilitate easy installation and removal, the heat spreader assembly includes, in one aspect of the invention, a plate (a "thermal donut") having an opening larger than the circuit module, and a removable thermal bridge member larger than the opening in the plate. The thermal bridge member contacts the second surface of the circuit module and the plate to couple the circuit module to the heat spreader.

The circuit module in one aspect comprises a thermally conductive substrate, and at least one integrated circuit chip, with an interconnect structure mounted on the substrate. The thermal bridge member may be bonded to the thermally conductive substrate of the circuit module. Alternatively, a pressure contact may be established between the substrate of the circuit module and the thermal bridge member.

The fastener comprises a releasable mechanism which allows the circuit module to be easily inserted or removed, without sacrificing the superior heat dissipation characteristics and interconnection characteristics of the assembly. Thus, according to one aspect, the fastener comprises a clamp plate coupled to the board with at least one riser coupled to the clamp plate. The board and thermal bridge plate include passages to receive the riser. The heat spreader includes an opening with an inside dimension larger than the outside dimension of the circuit module, but smaller than the outside dimension of the thermal bridge member. The thermal bridge member is clamped to the riser with sufficient force to hold the thermal bridge member in thermal contact with the heat spreader, and the circuit module in electrical contact with the board through the interposer. The clamp can be implemented using a screw, a spring loaded clip, or other technique which supplies sufficient force for good thermal and electrical contact in the assembly.

According to yet another aspect of the invention, an electronic assembly is provided which comprises a printed wiring board having a surface including an array of board contacts. A multiple chip module is included for mounting with the board that comprises a thermally conductive base. A first substrate on the first surface of the base includes a plurality of integrated circuit chips and an interconnect structure for the integrated circuits on the first substrate. A second substrate, such as made of printed wiring board material, is also mounted on the first surface of the thermally conductive base adjacent to the first substrate. An interconnect structure is included on the second substrate along with an array of circuit contacts. Conductors are included which connect the interconnect structure on the first substrate with the interconnect structure on the second substrate. A heat spreader assembly is provided in thermal contact with the thermally conductive base, and a fastener is used to couple the components together as discussed above. The use of the second printed wiring board substrate according to this aspect of the invention, substantially reduces the cost of the overall assembly by using a lower cost substrate for the area taken up by the array of circuit contacts, and a higher cost multiple chip module substrate for mounting of the integrated circuit chips. Of course, an integrated circuit chip may also be mounted on the second substrate if desired. This aspect of the invention can also be extended to include other types of multiple substrate, multiple chip modules which provide for increased flexibility in the manufacturing of systems using multiple chip modules.

The invention can also be characterized as a computer comprising a case having an openable cover. A circuit board is mounted within the case and has a mounting surface facing the openable cover of the case. The system includes a circuit module or modules which could, for instance, contain the host central processing unit and supporting circuitry, a graphics controller, a multi-media controller, or a system add-on. A heat spreader is mounted with the case. A fastener assembly, which when engaged fastens the mounting surface of the circuit board, the circuit module and the heat spreader together is provided, such that thermal contact is made between the circuit module and the heat spreader, and electrical contact is made between the circuit module and the circuit board. When the fastener assembly is disengaged, the circuit module may be removed through the openable cover of the case. The fastener assembly may take the structure as outlined above, such that the circuit module may be inserted and removed by the use of screws, or other simple clamping technologies.

According to yet another aspect of the present invention, the assembly may include a second circuit module, such as cache SRAM, stacked with the first circuit module. In this case, the fastening assembly establishes thermal contact between the second circuit module and the circuit board or other heat sink, and electrical contact between the second circuit module and the contacts on the circuit board and/or the first circuit module.

The invention can also be characterized as a method for assembling a computer having an openable cover, a circuit board within the cover and a heat spreader. The method includes:

providing an array of board contacts on the circuit board inside the computer accessible through the openable cover;

providing a circuit module including one or more integrated circuits and an interconnect structure, the interconnect structure including an array of circuit contacts; and mechanically fastening the circuit module to the circuit board through the openable cover of the computer such that thermal contact is made between the circuit module and the heat spreader, and electrical contact is made between the circuit module and the circuit board.

The step of mechanical fastening according to this aspect of the invention may include providing an interposer between the circuit board and the circuit module, a thermal bridge contacting the heat spreader and the surface of the circuit module; and fastening the circuit board, interposer, circuit module, thermal bridge member and heat spreader together using the mechanical fastening technologies outlined above.

Accordingly, the present invention provides a mounting technology for multiple chip modules particularly adapted to use in small laptop or notebook computers, or other small computer systems. The technology is also suitable for desktop systems or other large systems using integrated circuits. The invention is based on the use of a heat spreader to efficiently distribute the heat load to as much of the case as possible, lowering the difference in temperature through the case. Also, a clamping system is used to thermally couple the multiple chip module to the heat spreader as well as electrically connect the multiple chip module to the system printed wiring board. This allows compactness of the package as well as ease of assembly, which leads to lower costs. An interposer is used in one preffered embodiment for electrical connection to the system printed wiring board. This improves compactness and simplicity in the fabrication process, leading to lower cost as well as superior electrical characteristics for high speed circuits. In addition, the interposer allows all power filtering components to be moved off the MCM. Since these components may require a soldering or epoxy cure step for the MCM, moving them off the MCM helps lower the overall system cost by eliminating fabrication steps for the MCM itself. A thermal bridge can be used to allow the multiple chip module to be installed through the laptop case or other openable part of the case without sacrificing efficient thermal performance of the heat spreader. Furthermore, the technique can be used for providing easy module replacement, for upgrading systems, without sacrificing thermal or electrical performance of the mounting technology.

Other aspects and advantages of the present invention can be seen upon review of the figures, the detailed description, and the claims which follow.

DETAILED DESCRIPTION

Figure 1:
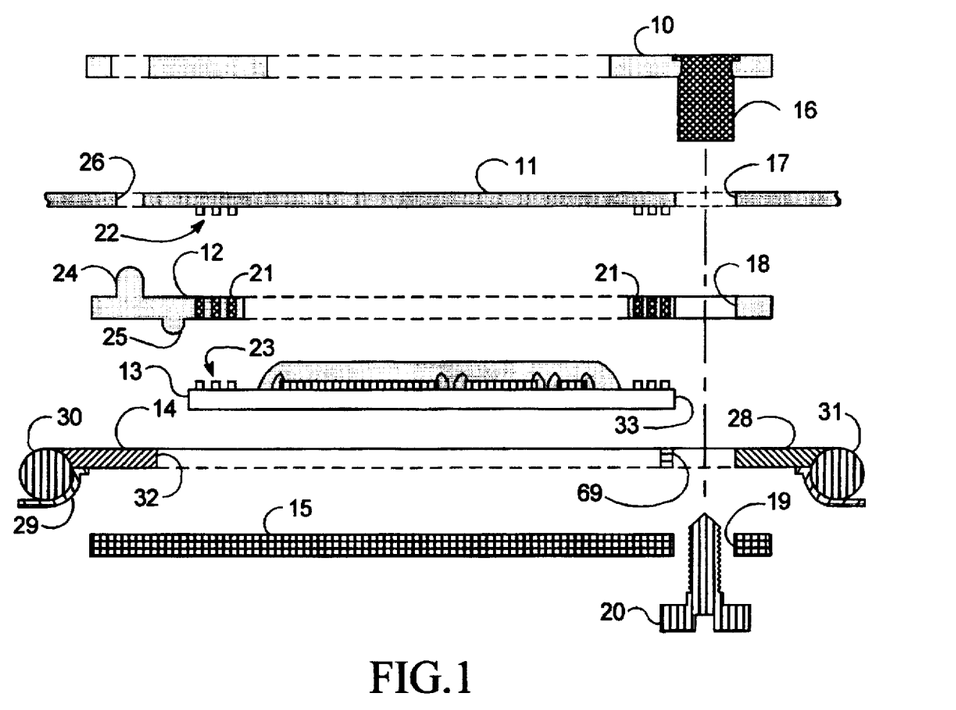
FIG. 1 shows an exploded view of the multichip module mounting assembly according to the present invention.
Figure 2:
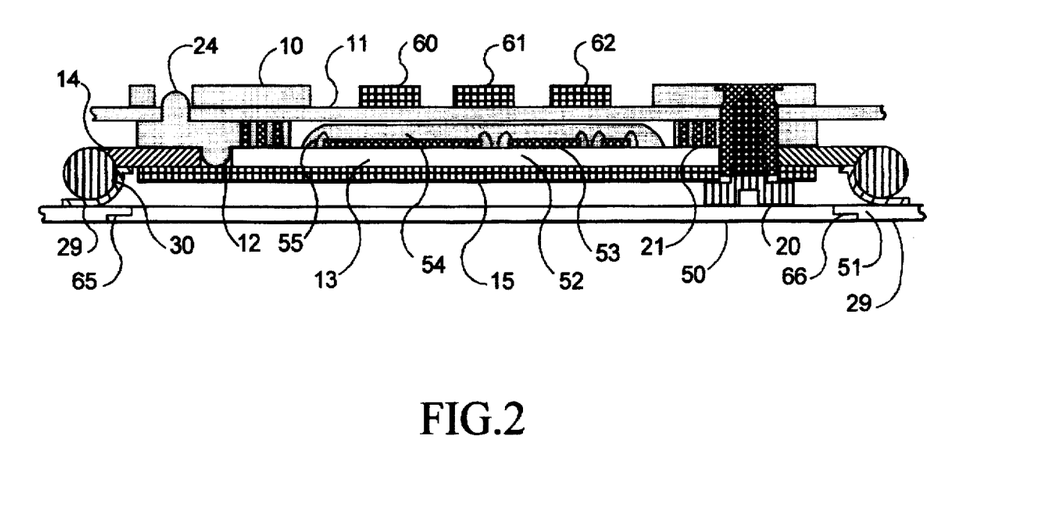
FIG. 2 shows the multichip module mounting assembly in a computer system.

A detailed description of a preferred embodiment is provided with reference to FIGS. 1 through 13, in which FIGS. 1 and 2 provide an expanded view and an assembled view of a preferred embodiment.

The assembly as shown in FIG. 1 includes a clamp plate 10 made of a material such as stainless steel. Next, a printed wiring board 11 or other circuit board technology is placed under the clamp plate 10 on which components of an electronic system are mounted. An interposer structure 12 is included below the circuit board 11. A multiple chip module 13 is below the interposer 12. A heat spreader assembly 14 and a thermal bridge plate 15 are below the circuit module 13.

The interposer 12 comprises a rigid or flexible plate with an array of conductors through the plate, arranged such that when pressure is applied to the array of conductors, electrical connection is made between contacts on either side of the plate. Thus, the interposer 12 may be of the type known as CIN::APSE (a trademark of Cinch, a division of Labinal Components and Systems, Inc., located in Elk Grove Village, Ill.) using so-called "fuzz button" conductors 21. The "fuzz button" conductors comprise a gold plated molybdenum wool which fills passages through the interposer material to provide the conductive pathways. Alternative interposer techniques may be used, such as Ampliflex and Ampliflat provided by Amp, Inc. of Harrisburg, Pa. Also, so-called z-flex interposer technology can be used, based on z-shaped wires imbedded in an elastomer, which establish electrical connection upon application of pressure. The interposer 12 may also be implemented with surface mount plug and socket connectors, with for example a male connector on the multiple chip module 13 and a female connector of the printed wiring board 11, or visa-versa, or with combinations of male and female connectors on the multiple chip module and mating connections on the printed wiring board. One example use of male/female connection sockets and plugs is described below with reference to FIG. 11.

The clamp plate 10 includes one or more self-clinching standoffs forming threaded risers 16. The printed wiring board 11, interposer 12, thermal donut 28 and thermal bridge member 15 include passages 17, 18, 69, 19 for receiving the riser 16. A screw 20 is used to clamp the assembly together.

The interposer 12 includes a template surrounding a plurality of conductors, such as conductor 21. The printed wiring board 11 includes an array of board contacts generally 22 (exaggerated height in the figure). Similarly, the multichip module 13 includes an array of circuit contacts generally 23 (exaggerated height in the figure). The conductors 21 provide for electrical connection between the circuit contacts in the array of circuit contacts 23, and board contacts in the array of board contacts 22 when the assembly is fastened together. Also in the interposer 12 are alignment bosses 24 and 25. The alignment boss 24 fits within a receiving passage 26 on the printed wiring board 11. The alignment boss 25 fits between the edge of the multichip module 13, and the edge of the heat spreader assembly 14.

The heat spreader assembly 14 comprises a thermal "donut" member 28, which is coupled to a copper, or other heat conductive material, spread plate 29 which fans out through the assembly in which the circuit board is mounted to spread the heat. The spread plate may be quite large, for instance 8 inches by 10 inches or more. Also, heat pipes 30, 31 may be included in the spreader assembly to assist in transferring the heat away from the thermal donut member 28. As can be seen, the thermal donut member 28 has an inside dimension 32 which is larger than the outside dimension 33 of the multichip module 13.

The thermal bridge member 15 may comprise a hard copper material, diamond, aluminum, or other efficient heat conductor, which can make efficient thermal contact with the thermal donut member 28 under pressure of the screw. Also, heat pipes could be on, or embedded in, the thermal bridge. A compliant, heat conductive gasket or thermal grease may be placed between the thermal bridge member 15 and the thermal donut 28 if necessary.

The screw 20 and riser 16 make an assembly for fastening the components of the stack together. The riser may not be necessary for a given implementation, being replaced for instance by a simple threaded recess in the clamp plate. The stack may alternatively be clamped using a spring loaded clip, or other mechanical fastener which develops sufficient force to effect the electrical contacts in the interposer 12 as well as the thermal contact between the thermal bridge 15, heat spreading donut 28 and the circuit module. In the case of the CIN::APSE interposer, this pressure is about 2 ounces or more per conductor in the interposer.

FIG. 2 shows the assembled package mounted on a case 50 of a computer system, such as a laptop computer. In this illustration, the heat spreader assembly 29 is coupled to the case 50 using a compliant and thermally conductive adhesive film 51 to facilitate heat transfer from the heat spreader to as much of the case as possible. The assembled components are given the same reference numbers in FIG. 2 as in the expanded view of FIG. 1.

Also, FIG. 2 shows some additional features. Thus, with reference to FIG. 2 it can be seen that the multichip module includes a substrate 52 which is made of a thermally conductive material such as aluminum, copper, or diamond. A plurality of integrated circuits 53 are mounted on the substrate. A die passivation material 54 covers the integrated circuits. The integrated circuits are wired by means of the wires 55 to an interconnect structure (not shown in FIG. 2) which includes the array of circuit contacts 23. Also, because of the short lead distances involved using the interposer technology, the printed wiring board may have mounted thereon power filter capacitors 60, 61, 62 for providing supply filtering to the processing resources in the multichip module.

Alternative multichip module technology may be used as well. For instance, integrated circuits can be mounted using flip chip techniques on a membrane which includes an interconnect structure, such as a multilayer polyimide/ copper interconnect. The membrane is supported on a frame, with the chips mounted inside the frame. An array of contacts may be formed on the side of the membrane opposite the chips, and overlapping the frame, such that the rigid frame is used to transfer pressure to the interposer structure. Alternatively, the array of contacts may be inside the frame, in an unsupported part of the membrane. In this case electrical contact is made to the printed wiring board without an interposer by applying pressure to the membrane behind the array of contacts with a compliant pressure pad between the membrane and the thermal bridge plate.

Also shown in FIG. 2, the case 50 for the computer may include an openable cover as indicated by the cuts 65 and 66 in the drawing. Thus, by removing the openable cover, and releasing the screw 20, the multichip module 13 can be easily removed or replaced from the back side of the printed wiring board. Furthermore, the removal and replacement of the multichip module does not sacrifice the quality of electrical connection or the thermal characteristics of the assembly.

An alternative system inverts the structure of FIG. 2, with the screw being fastened from the top of the clamp plate on the print wiring board. In this case no thermal bridge is necessary. Rather the heat spreader assembly may be continuous across the back of the circuit module, in which the thermal donut is replaced by a solid plate, having threaded recesses or a threaded riser assembly attached thereto. This way the screws fasten the heat spreader, circuit module, interposer and printed wiring board together to establish the appropriate thermal and electrical contacts.

Figure 3:
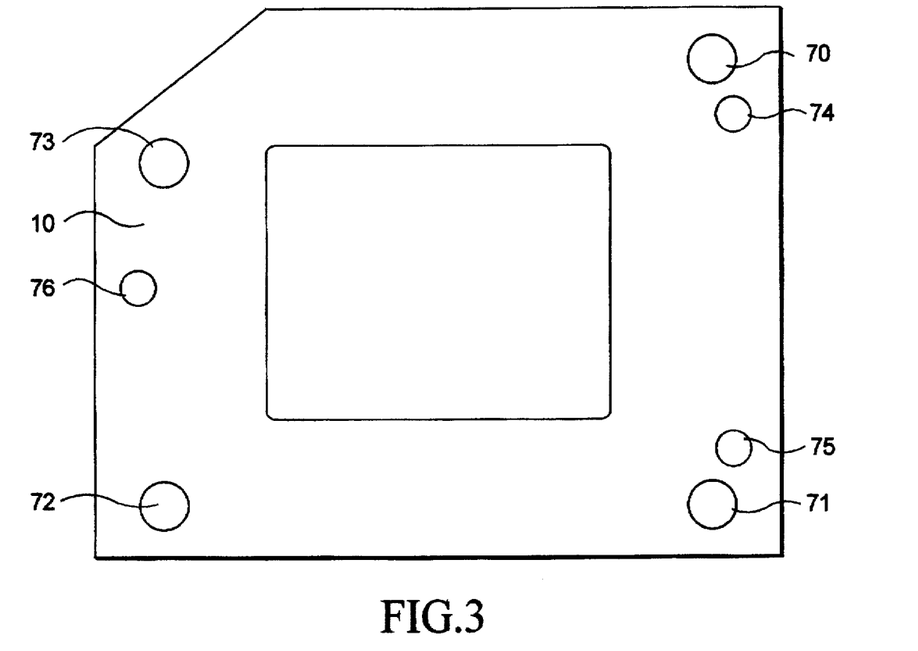
FIG. 3 illustrates the clamp plate in the assembly of FIG. 1.

FIGS. 3 through 6 provide a top view of the clamp plate, interposer, multichip module and thermal donut, and thermal bridge member, respectively. Thus, FIG. 3 illustrates a clamp plate 10 which can be used according to the present invention. The clamp plate 10 of FIG. 3 includes four riser assemblies 70, 71, 72, 73. Also, three passages 74, 75, 76 are included to receive the boss members, such as boss member 24 on the interposer as shown in FIG. 1.

Figure 4:
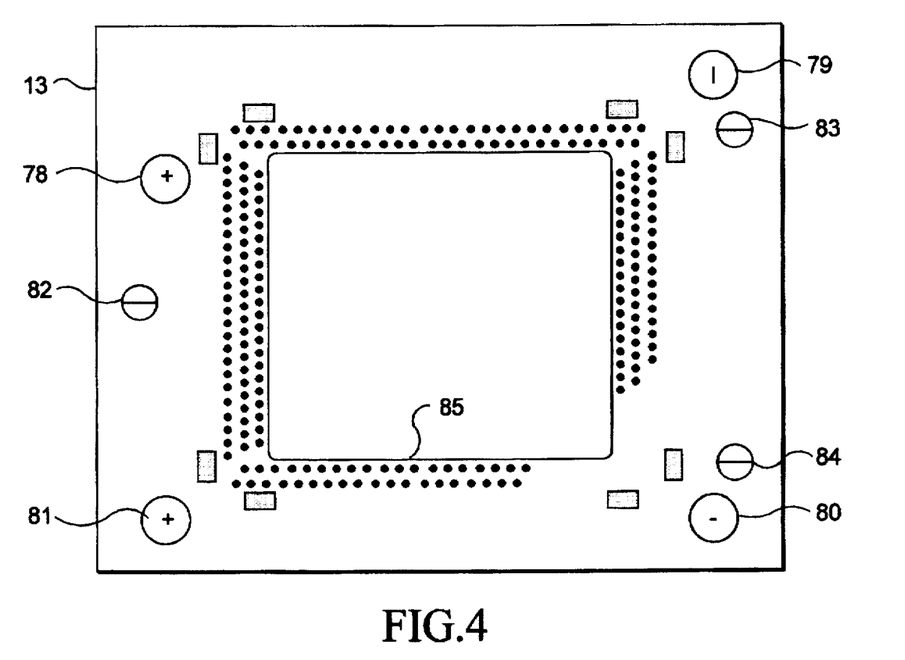
FIG. 4 illustrates the interposer in the assembly of FIG. 1.

FIG. 4 shows the interposer 13. The interposer 13 includes passages 78, 79, 80, 81 for receiving the risers 70 through 73 of the clamp plate 10. Also, the alignment bosses 82, 83, 84 are included which register with the passages 74 through 76 of the clamp plate, and with similar passages through the printed wiring board, such as passage 26 as shown in FIG. 1.

The interposer includes an inside opening 85 having an inside dimension. Also on the interposer is an array of conductors, such as conductor 86. In the embodiment illustrated, there are 213 conductors in the array based on the so-called "fuzz button" technology. Many more are possible.

Figure 5:
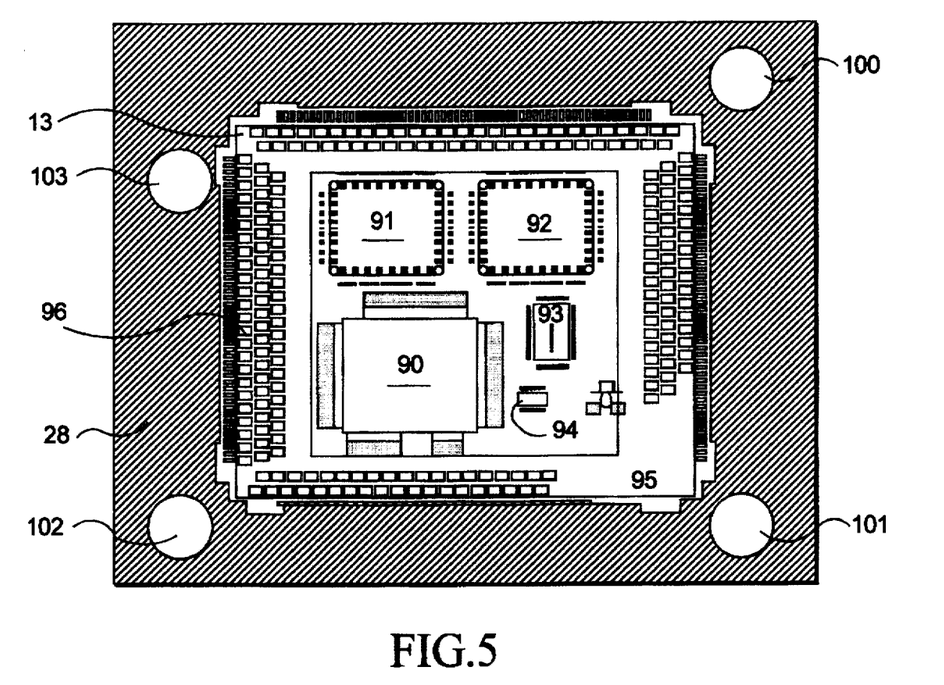
FIG. 5 illustrates the thermal donut of the heat spreader assembly and multichip module in the assembly of FIG. 1.

FIG. 5 shows the multichip module 13 and the thermal donut member 28. As can be seen, the multichip module 13 fits inside the thermal donut 28. It includes a plurality of integrated circuits, 90, 91, 92, 93, 94, and an interconnect structure 95 which includes an array of circuit contacts, such as contact 96. The array of circuit contacts corresponds with the array of conductors, such as conductor 86 in the interposer 13, and with a corresponding array of board contacts on the printed wiring board 11, such as contacts 22 shown in FIG. 1. The thermal donut 28 includes passages 100, 101, 102, 103 for receiving the screw 20 and the risers 70 through 73 as shown in FIG. 3.

According to one aspect of the invention, the integrated circuits 90 through 94 comprise processing resources for a laptop computer, such as a host central processing unit, and memory controller chips and the like supporting the host microprocessor. Using multiple chips, a variety of host architectures can be implemented on the multichip module, all having a standardized array of contacts, such as contact 96. Using a standardized array of contacts for a variety of host processors, allows a common printed circuit board to be utilized in the manufacture of computers, independent of the host processor chosen. Thus, for example, a single printed wiring board can be utilized for 386 class processors, 486 class processors, Pentium class processors, and a variety of RISC based processors which are being introduced.

Figure 6:
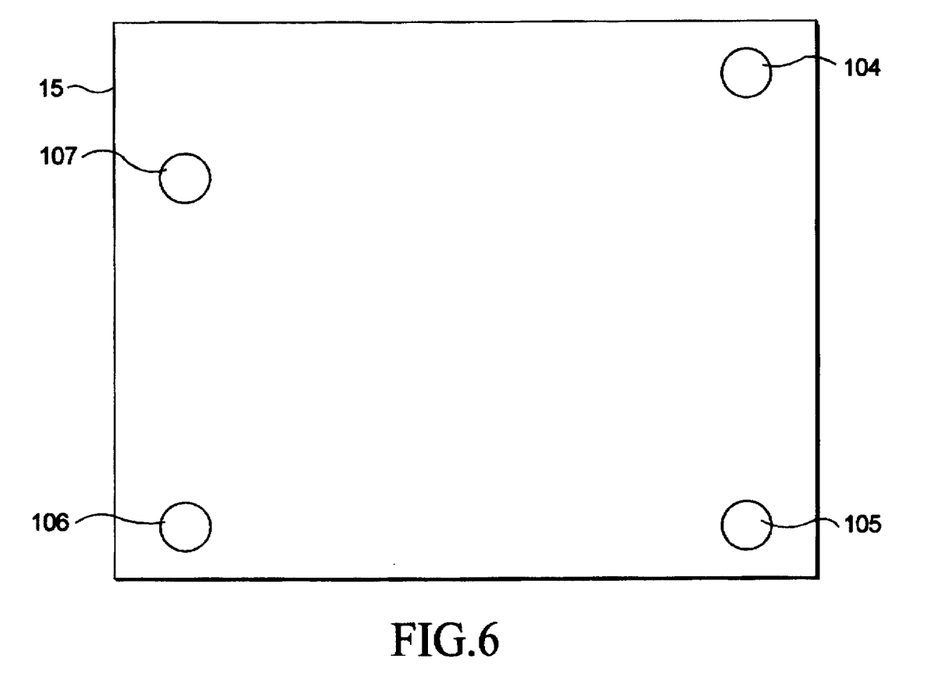
FIG. 6 illustrates the thermal bridge member in the assembly of FIG. 1.

FIG. 6 illustrates the configuration of the thermal bridge member 15 which may be bonded to the substrate 52 of the multichip module, such as illustrated in FIG. 2, or contacted with it mechanically using the clamping mechanism of the present invention. As can be seen, the thermal bridge member 15 includes passages 104, 105, 106, 107 for receiving the screw 20 and the risers 70 through 73 as shown in FIG. 3.

Figure 7:
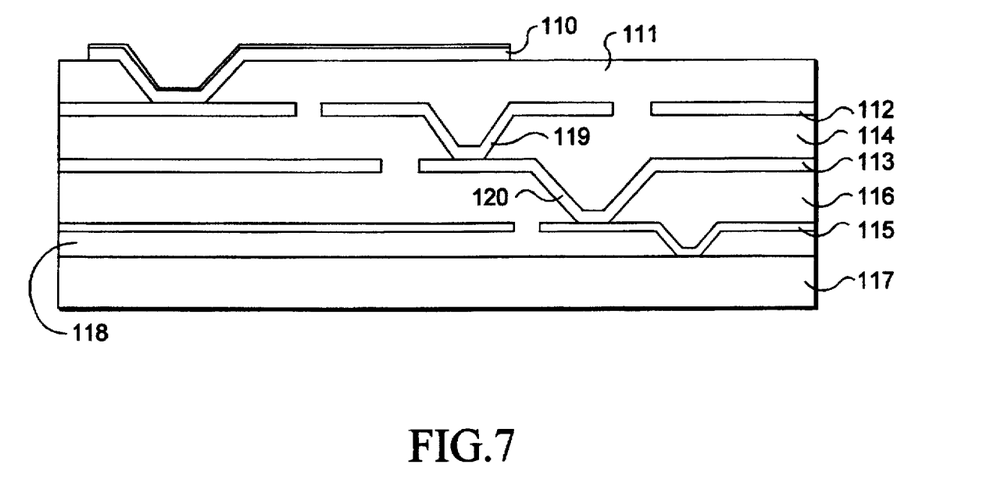
FIG. 7 illustrates a technology which may be used for the interconnect structure for the multichip module of FIG. 1.

FIG. 7 illustrates an interconnect structure for the MCM. Thus, the interconnect structure may be made using commercially available substrate processes provided by Micro-Module Systems, Inc. of Cupertino, Calif. One to seven layers, or more, of interconnect structure can be built using the standard process.

The interconnect structure as illustrated in FIG. 7 consists of a pad 110 having six microns of copper, two microns of nickel, and two microns of aluminum. The pad is isolated from underlying interconnect by twelve microns of polyimide in the region 111. A y-signal interconnect layer is included based on four microns of copper 112. An x-interconnect layer 113 consisting of about four microns of copper is included, separated from the y-interconnect layer 112 by about six microns of polyimide in the region 114. A power plane layer 115 consisting of about 2 microns of copper underlies the x-interconnect layer 113 and is separated therefrom by about twelve microns of polyimide in the region 116. A ground plane 117 consisting of fifty mils of aluminum in this illustration (or two microns of copper), is included, separated from the power plane conductor 115 by a supply bypass dielectric of about 3.5 microns of polyimide in the region 118. The various layers are interconnected as illustrated in the figure by the via structures generally 119 and 120. The interconnect layers are defined using standard photolithography equipment, traces are sputtered and then electroplated up to the necessary thickness.

Figure 8:
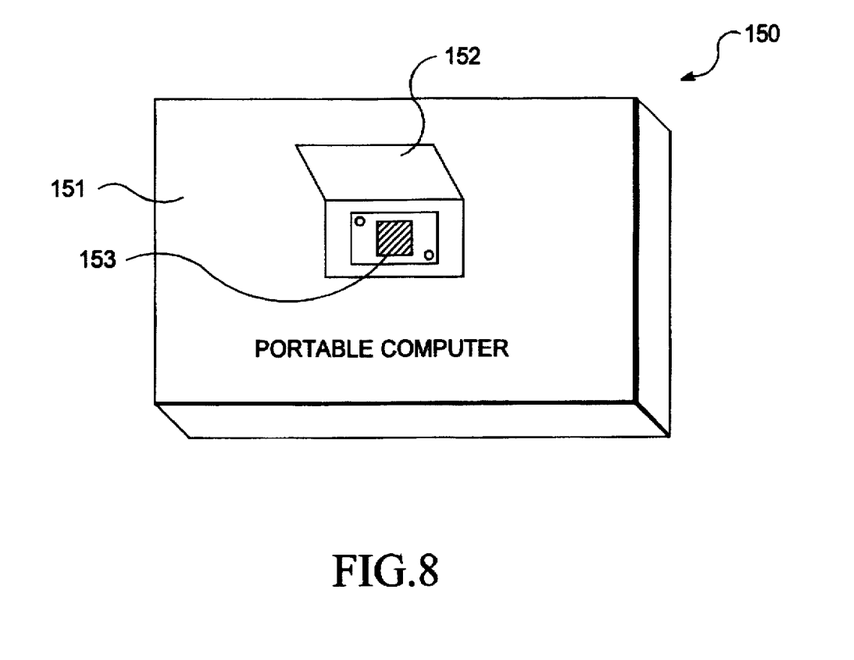
FIG. 8 provides a perspective of a portable computer in which the mounting assembly of the present invention is used.

FIG. 8 provides a simplified perspective of an application of the present invention with a portable computer 150. Thus the portable computer includes a case 151, with an openable cover 152. Within the cover 152, the multichip module mounting assembly 153 according to the present invention is accessed. Thus, unskilled labor or owners of the portable computer 150, can replace the multichip module 153 with a simple screwdriver. The openable cover may take a variety of forms, from a substantial portion of the case for the computer, which when removed exposes the opening in the heat spreader, to a small cover which is coupled to a slot in the case in which the mounting assembly is found.

Figure 9:
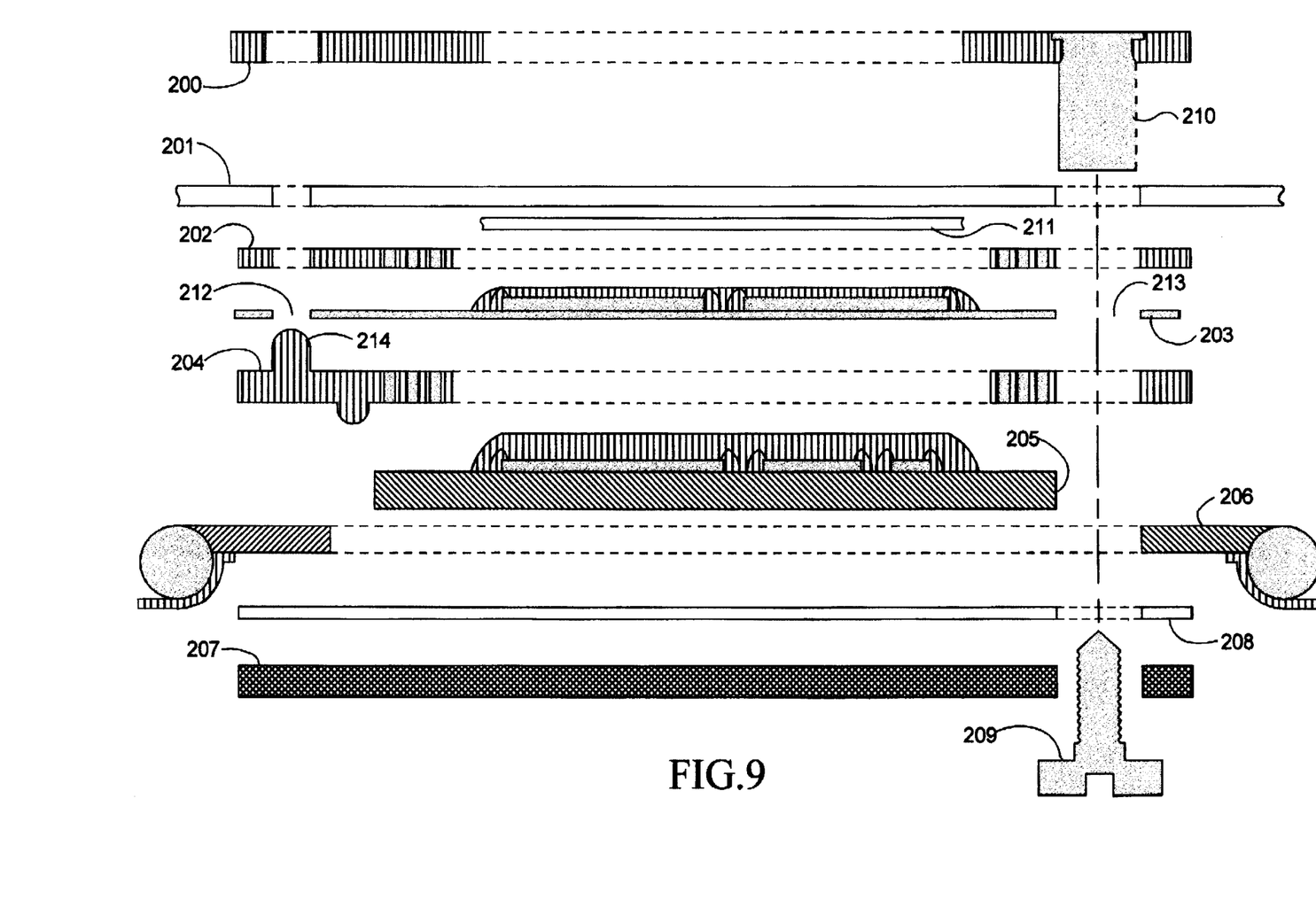
FIG. 9 illustrates the mounting assembly according to the present invention with stacked multichip modules.

FIG. 9 illustrates yet another embodiment based on stacked multichip modules. The components in FIG. 9 are illustrated in an exploded view. Obviously when assembled, the structure is quite compact as can be visualized with reference to FIG. 2.

Thus, a mounting assembly according to the present invention with stacked multichip modules includes in the embodiment shown in FIG. 9, a stainless steel top clamp plate 200 which is placed over the printed wiring board 201.

A first interposer 202 is placed between the printed wiring board 201, and a top multichip module 203. A second interposer 204 is placed between the top multichip module 203 and a bottom multichip module 205. The heat spreader assembly 206 is mounted within the case of the computer. A thermal bridge member 207 is placed in thermal contact with the substrate of the bottom multichip module 205. Also, a thermally conductive, compliant gasket 208 may be placed between the substrate of the bottom multichip module 205 and the thermal bridge member 207, and in the region between the thermal bridge member 207 and the heat spreading assembly 206. The gasket 208 will account for any mismatches in the surfaces of the materials. The gasket 208 may be manufactured using conformable thermally conductive elastomers, such as are commercially available, for example, from Thermagon of Cleveland, Ohio.

A screw 209 is used with riser 210 coupled to the clamp plate 200 to form a clamp mechanism. As mentioned above, other clamping technologies could be used depending on the needs of a particular implementation.

The stacked system of FIG. 9 is designed such that the bottom multichip module 205 should be the primary source of heat, and directly coupled to the heat spreader assembly 206 through the thermal bridge member 207. The top multichip module 203 might be a lower energy system, such as a cache upgrade for a processor which might dissipate a watt or two. The heat from the top multichip module 203 can thus be efficiently spread in the printed wiring board 201 itself. To facilitate the transfer of heat from the top multichip module 203 to the printed wiring board, a conformable thermally conductive elastomer gasket 211 may be placed between the multichip module 203 and the printed wiring board 201.

As shown in FIG. 9, the top multichip module 203 comprises a multilayer wiring board 250, such as a polyimide/copper structure as discussed above, with integrated circuits 251, 252 on the top, and on the integrated circuit 253 (or circuits) on the bottom. The top and bottom integrated circuits may be encapsulated in a protective epoxy as shown. Alternative embodiments may have chips on only one side.

Furthermore, the top multichip module 203 may include contacts on both sides of the substrate to provide contacts to the interposers 204 and 202 such that the second multichip module 203 is in electrical communication with both the bottom multichip module 205 and contacts on the printed wiring board 201.

The top multichip module 203 can have passages, such as passages 212 and 213 for receiving the alignment boss 214 on the first interposer 204 and the riser 210 on the clamp plate 200. Alternatively, it can be designed with a smaller outer dimension such that the riser and boss 214 do not come into play. However, some alignment technology must be utilized for ensuring that the contacts are properly made.

Figure 10:
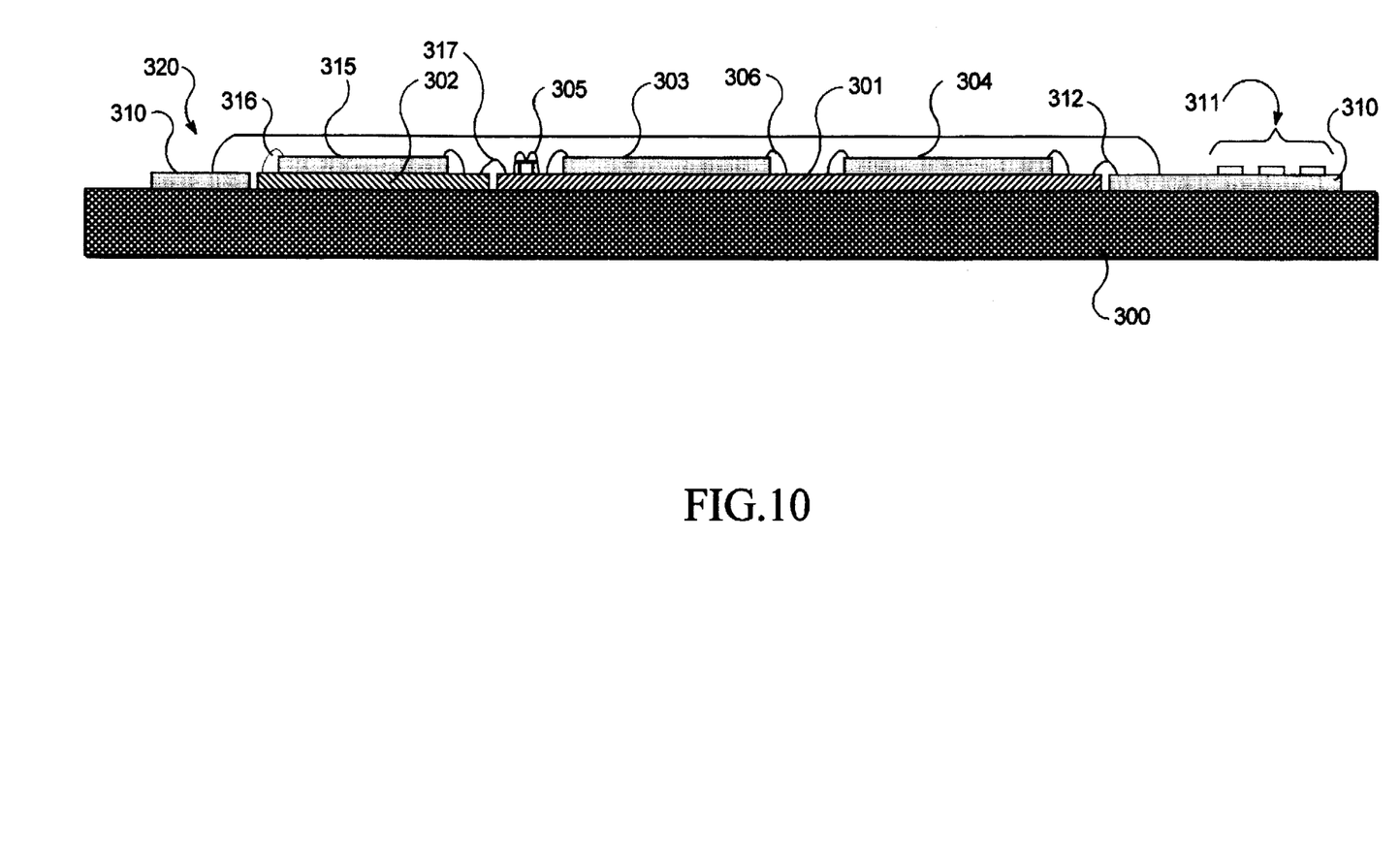
FIG. 10 illustrates an alternative embodiment of the multiple chip module including a plurality of substrates on a single thermal base plate according to the present invention.

FIG. 10 illustrates a multiple chip module which includes a plurality of separate substrates on a single thermal base plate. Thus, in FIG. 10, the thermal base plate 300 is provided which is manufactured using aluminum or other rigid thermally conductive material. This thermal base plate 300 corresponds to the thermal bridge plate 15 in the assembly of FIGS. 1 and 2.

The assembly in FIG. 10 includes a first multiple chip module substrate 301 and a second multiple chip module substrate 310 mounted on the thermal base plate 300. The first multiple chip module substrate 301 includes integrated circuits 303 and 304, such as a host CPU and a supporting chip set for a personal computer. Also coupled to the substrate 301 in the embodiment shown in FIG. 10 is a thermal sensing integrated circuit 305, such as a National Semiconductor LM45 or LM75. The substrate 301 includes an interconnect structure such as that described above with reference to FIG. 7. Also, wire bonds, for instance bond wire 306, are used for coupling the integrated circuit pads to the interconnect structure on the substrate 301.

The multiple chip module shown in FIG. 10 also includes a second substrate 310. The second substrate 310 includes an array of circuit contacts generally 311, having exaggerated height in the figure, which correspond to the circuit contact array 23 on the multiple chip module substrate 13 in the system of FIGS. 1 and 2. Conductors 312 provide connection between the interconnect structure on the substrate 301, and the interconnect structure on the substrate 310. According to a preferred embodiment, the substrate 310 is manufactured using printed wiring board material, which may be much lower cost than the aluminum substrate, polyimide/copper interconnect structure of the substrate 301.

A third substrate 302 is shown in FIG. 10 on the multiple chip module, which may include one or more integrated circuits, such as a cache memory expansion chip 315. The chip 315 is coupled to the interconnect structure on the substrate 302 using wire bonds, such as wire bond 316. Also, conductors 317 are used for coupling the interconnect structure of the substrate 302 with the interconnect structure of the substrate 301. The printed wiring board substrate 310 extends around the multiple chip module as shown. In this embodiment, there are no contacts in the area generally 320 of the printed wiring board substrate 310. This allows for variations of the same multiple chip module to be mounted in the same foot print, some of the variations having the cache extension on substrate 302, and some manufactured without the substrate 302 at all. Thus, a three sided interposer and interconnect structure would be utilized with this type of structure. Alteratively, the contact array on the printed wiring board may extend on all four sides of the structure.

Although the substrates 301, 302, 310 are shown in the figure flush with a flat surface of the thermal base plate 300, these substrates may be recessed within cutouts in the base plate 300 if desired, for improved thermal coupling or other reasons as suits the needs of a particular implementation.

Use of the thermal sensor chip 305 on the substrate 301 provides close coupling of the thermal sensing with the chips on the substrate. Thus, if one of the chips on the substrate is a host CPU which generates significant waste heat, the thermal sensing chip can be utilized with control logic to prevent overheating of the CPU. Close coupling of the thermal sensing with the CPU provides greater control over thermal cycling processes than is available in prior art techniques.

The printed wiring board substrate 310, according to one example, is made using a multilayer interconnect, resin printed wiring board, using a resin such as so-called FR5 or BT. Such multilayer resin printed wiring boards are available from a variety of manufacturers, including West Coast Circuits of Watsonville, Calif., and Yamamoto Manufacturing U.S.A., Inc. of San Jose, Calif. Because of the space is a premium in the manufacturing of multichip substrates, such as the substrate 301, the use of the printed wiring board extension can significantly reduce the overall cost of a multiple chip module system such as that described in the present application.

According to a preferred embodiment, the pads on the MCM substrates are implemented with gold plating, such as gold plated copper, or gold plated nickel, to facilitate wire bonds. The wire bonding utilized between the substrates and between the chips and the substrates, can be made using any of a variety of wire bonding techniques. For instance, so-called ball bonding and stitch bonding may be used. In a preferred system, a combination of ball and stitch bonding is utilized. According to ball bonding, a gold wire is heated at the tip to form a melted drop. This melted drop is then contacted with the pad which forms an electrical connection as it cools. According to stitch bonding, the wire is bonded to the pad by a combination of heating and compression under ultrasonic vibration. The wire bonding can be accomplished using wire in a wide range of sizes, including for example; 1.3, 1.0, and 0.8 mil gold wire.

Alterative systems can be implemented with other chip connector techniques, including so-called flip chip bonding, which utilize alternatives to wire bonding to form conductors to the interconnect on the MCM substrate.

Figure 11:
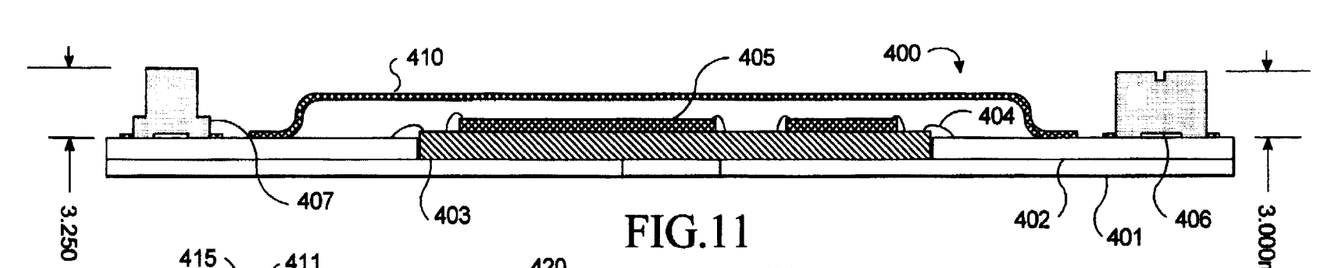
FIG. 11 illustrates a cross sectional view of an alternate embodiment of the multichip module according to the present invention using plug and socket connectors in place of the interposer, and using an electromagnetic interference EMI shield as a cap over the MCM circuitry.

FIG. 11 is a crossectional view of an assembled multiple chip module according to an alternative embodiment of the present invention. Multiple chip module 400 includes an aluminum base plate 401, a printed wiring board donut 402 and a MCM interconnect substrate 403. MCM interconnect substrate 403 is coupled to the printed wiring board donut 402 by wire bonding (e.g. wire bond 404). A plurality of integrated circuits (e.g. integrated circuit 405) is mounted on the MCM interconnect substrate 403. The assembly is constructed in a manner similar to that described above with reference to FIG. 10.

Replacing the array of contacts of FIG. 10 on the printed wiring board donut 402 is a male and female connector assembly, such as lead socket 406 and lead plug 407. Matching lead plugs and lead sockets are mounted on the opposing motherboard in place of the array of contacts on the motherboard assembly. In the embodiment described, the lead socket carries 160 leads, and is made using commercially available techniques. Similarly, the lead plug 407 carries 160 leads and is similarly commercially available. Other combinations of male and female connector technologies can be utilized in various combinations that suits the needs of a particular design on the multiple chip module assembly 400.

Also shown in FIG. 11 is an electromagnetic interference EMI shield 410. The EMI shield 410 is manufactured using an aluminum, copper, or other conductive material and is placed in contact with the power plane or the ground plane in order to shield the high frequency signals inside the MCM from outside interference and prevent the high frequency signals inside the MCM from causing interference among other components. The EMI shield 410 is laid over the MCM interconnect substrate 403, contacting the printed wiring board donut 402 in a region around the periphery of the device. The EMI shield 410 is mounted on the assembly using screws or clips or the like, in order to establish a good contact between the EMI shield 410 and the ground plane in the preferred system.

Figure 12:
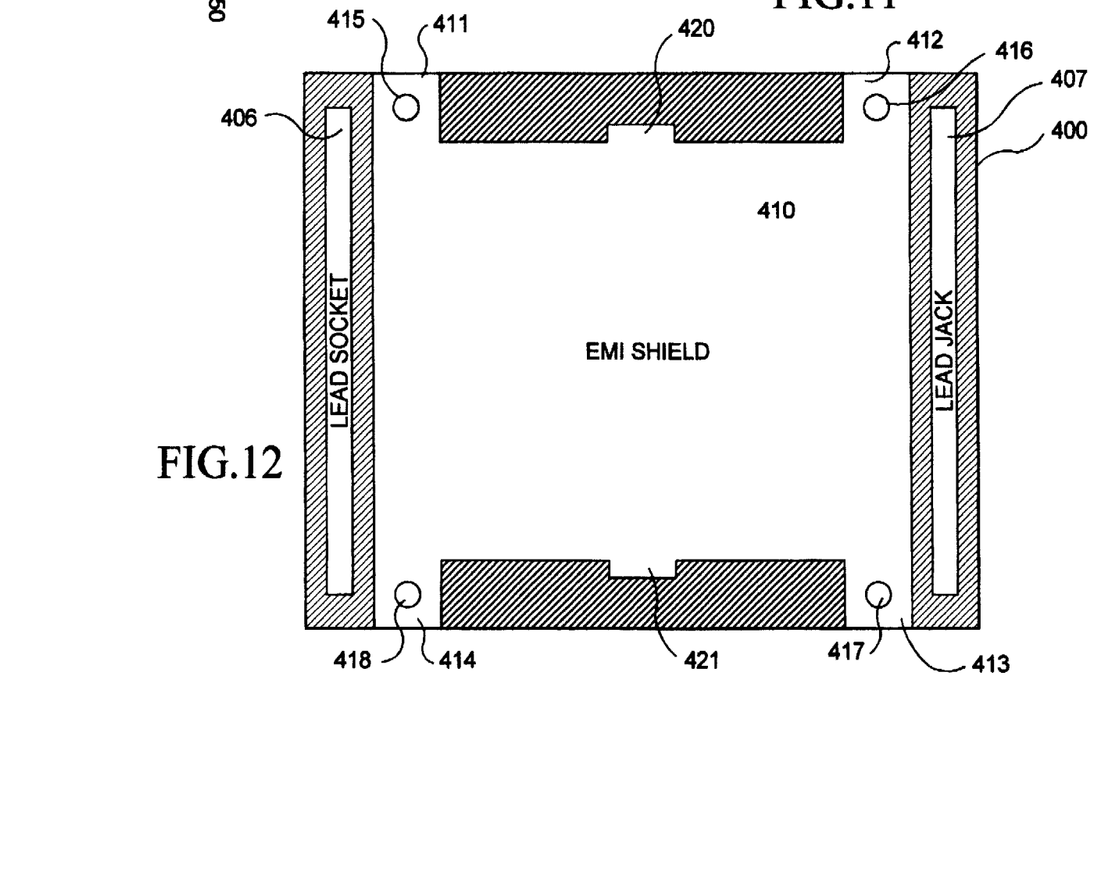
FIG. 12 illustrates the layout of the EMI shield according to the embodiment of FIG. 11.

FIG. 12 illustrates a layout of one preferred EMI shield configuration. Thus, the multiple chip module 400 includes a lead jack 407 and a lead socket 406. The EMI shield 410 is laid out such that tabs 411, 412, 413 and 414 extend to the sides of the module 400, and have openings 415, 416, 417 and 418 which accept screws used in mounting the MCM assembly 400, as discussed above. Also, the EMI shield 410 has clips 420 and 421 which pass through openings (not shown in FIG. 12) through the printed wiring board donut to contact the ground plane on the back side, and to aid in securing the EMI shield 410 on the assembly 400.

Figure 13:
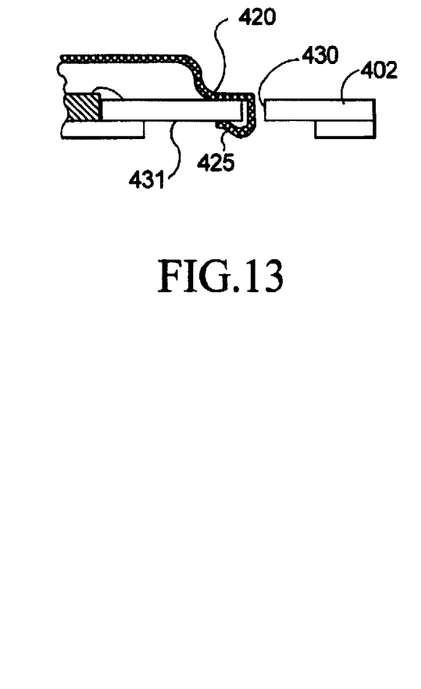
FIG. 13 illustrates implementation of a clip element of the EMI shield for the embodiment of FIGS. 11 and 12.

FIG. 13 illustrates the manner in which the clip 420 passes through an opening 430 in the printed wiring board donut 402, and wraps around such that an extension 425 of the clip 420 contacts the under surface 431 of the printed wiring board donut 402, to aid securing the EMI shield 410 on the MCM assembly 400, and to establish a ground contact to the under side of the assembly.

The multichip module mounting process according to the present invention can be particularly applied to the manufacturing of computers, such as laptop or portable computers. These devices may be fully assembled with displays and keyboards and the like, with the processing module implemented on a multichip module such as those described herein. The final assembly step for the computer involves opening the cover on the laptop, and inserting a multichip module by the techniques described above. Thus, the circuit board is provided with an array of contacts and an interposer mounted thereon. When the multichip module is to be inserted, it is simply dropped into the opening of the heat spreader assembly, the thermal bridge plate is placed over the module and tightened down to make good thermal and electrical contact. In addition to manufacturing the device in this manner, multichip modules can be replaced to provide for upgrades of computer systems by users of such systems in the field.

Accordingly, the present invention provides multichip module mounting technology for use with laptop or notebook computers (and any other systems using integrated circuits) which achieves several advantages. Efficient thermal dissipation is accomplished without requirement of a fan. The size in layout as opposed to single chip component structure is vastly reduced. The assembly is low cost and simple to manufacture. The system provides very good electrical characteristics, capable of handling 100 MHz clocks and higher. Further, the system is easily installable into a completely assembled laptop/notebook case, so that it can installed by unskilled labor, or consumers using simple tools.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An electronic assembly, comprising:
  a board having a surface including an array of board contacts;
  a thermally conductive base having a first surface and a second surface;
  a first substrate on the first surface of the thermally conductive base including at least one integrated circuit chip and an interconnect structure for the integrated circuit mounted on the first substrate;
  a second substrate on the first surface of thermally conductive base adjacent the first substrate including an interconnect structure and an array of circuit contacts;
  conductors connecting the interconnect structure on the first substrate with the interconnect structure on the second substrate;
  a connector between the board and the second substrate, including conductors between circuit contacts in the array of circuit contacts on the second substrate and board contacts in the array of board contacts on the board;

a heat spreader assembly; and a fastener which fastens the thermally conductive base to the board and to the heat spreader assembly such that thermal contact is made between the thermally conductive base and the heat spreader assembly, and electrical contact is made through the connector between the array of circuit contacts and the array of board contacts.

2. The assembly of claim 1, wherein the heat spreader assembly includes:

a plate having an opening larger than an outside perimeter of the first and second substrates but smaller than an outside perimeter of the thermally conductive base.

3. The assembly of claim 2, wherein the first substrate comprises thermally conductive material, and the thermally conductive base is bonded to the first substrate.

4. The assembly of claim 1, wherein the fastener comprises a clamp plate coupled with the board, and means for clamping the board, the thermally conductive base, and the heat spreader assembly to the clamp plate.

5. The assembly of claim 4, wherein the means for clamping comprises a releasable mechanism, such that at least the first substrate, the second substrate, and the thermally conductive base may be removed.

6. The assembly of claim 5, wherein the releasable mechanism comprises a screw.

7. The assembly of claim 1, including a third substrate on the first surface of the thermally conductive base, including at least one integrated circuit chip and an interconnect structure for the integrated circuit mounted on the third substrate, and conductors for connecting the interconnect structure on the third substrate to the interconnect structure on the first substrate.

8. The assembly of claim 1, wherein the second substrate comprises a resin printed wiring board.

9. The assembly of claim 1, including a thermal sensor mounted on the first substrate.

10. The assembly of claim 1, wherein the connector comprises a socket on one of the board and the second substrate, and a plug on one of the second substrate and the board to mate with the socket.

11. The assembly of claim 1, wherein the connector comprises a plate having an array of conductors disposed through the plate, arranged such that when pressure is applied to the array of conductors, electrical connection is made.

12. The assembly of claim 1, including an electromagnetic interference shield over the first substrate.

13. An electronic assembly, comprising:

a board having a surface including an array of board contacts;

a thermally conductive base having a first surface and a second surface;

a first substrate on the first surface of the thermally conductive base including at least one integrated circuit chip and an interconnect structure for the integrated circuit, the first substrate comprising a metal base;

a second substrate on the first surface of thermally conductive base adjacent the first substrate including an interconnect structure and an array of circuit contacts, the second substrate comprising a resin printed wiring board;

conductors connecting the interconnect structure on the first substrate with the interconnect structure on the second substrate;

a connector between the board and the second substrate, including conductors between circuit contacts in the array of circuit contacts on the second substrate and board contacts in the array of board contacts on the board;

a heat spreader assembly; and a fastener which fastens the thermally conductive base to the board and to the heat spreader assembly and fastens the second substrate through the connector to the board, such that thermal contact is made between the thermally conductive base and the heat spreader assembly, and electrical contact is made between the array of circuit contacts and the array of board contacts.

14. The assembly of claim 13, wherein the heat spreader assembly includes:

a plate having an opening larger than an outside perimeter of the first and second substrates but smaller than an outside perimeter of the thermally conductive base.

15. The assembly of claim 13, wherein the fastener comprises clamp plate coupled with the board, and means for clamping the board, the thermally conductive base, and the heat spreader assembly to the clamp plate.

16. The assembly of claim 13, wherein the means for clamping comprises a releasable mechanism, such that at least the first substrate, the second substrate and the thermally conductive base may be removed.

17. The assembly of claim 16, wherein the releasable mechanism comprises a screw.

18. The assembly of claim 13, including a third substrate on the first surface of the thermally conductive base, including at least one integrated circuit chip and an interconnect structure for the integrated circuit mounted on the third substrate, and conductors for connecting the interconnect structure on the third substrate to the interconnect structure on the first substrate.

19. The assembly of claim 13, including a thermal sensor mounted on the first substrate.

20. The assembly of claim 13, wherein the connector comprises a socket on one of the board and the second substrate, and a plug on one of the second substrate and the board to mate with the socket.

21. The assembly of claim 13, wherein the connector comprises a plate having an array of conductors disposed through the plate, arranged such that when pressure is applied to the array of conductors, electrical connection is made.

22. The assembly of claim 13, including an electromagnetic interference shield over the first substrate.

* * * * *